US012701828B2

(12) United States Patent (10) Patent No.: US 12,701,828 B2
Jain et al. (45) Date of Patent: Aug. 4, 2026

(54) DISLOCATION REDUCTION IN SEMICONDUCTOR COMPOUNDS

(71) Applicant: Sensor Electronic Technology, Inc., Columbia, SC (US)

(72) Inventors: Rakesh B. Jain, Elgin, SC (US); Mohamed Lachab, West Columbia, SC (US); Joseph Dion, Columbia, SC (US); Brandon Alexander Robinson, Columbia, SC (US); Devendra Diwan, Columbia, SC (US); Mark Geppert, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 515 days.

(21) Appl. No.: 18/122,513

(22) Filed: Mar. 16, 2023

(65) Prior Publication Data

US 2023/0299238 A1 Sep. 21, 2023

Related U.S. Application Data

(60) Provisional application No. 63/321,539, filed on Mar. 18, 2022.

(51) Int. Cl.
*H10H 20/825* (2025.01)
*H10H 20/815* (2025.01)
*H10H 20/82* (2025.01)

(52) U.S. Cl.
CPC ...... *H10H 20/8252* (2025.01); *H10H 20/815* (2025.01); *H10H 20/82* (2025.01)

(58) Field of Classification Search
None
See application file for complete search history.

(56) References Cited

U.S. PATENT DOCUMENTS

| | | | |
|---|---|---|---|
| 10,032,956 B2 | 7/2018 | Shatalov et al. | |
| 10,211,048 B2 | 2/2019 | Sun et al. | |
| 10,490,697 B2 | 11/2019 | Jain et al. | |
| 2008/0308835 A1* | 12/2008 | Pan | B82Y 20/00 |
| | | | 438/46 |
| 2013/0193480 A1* | 8/2013 | Sun | H01L 21/0242 |
| | | | 438/478 |
| 2016/0079408 A1 | 3/2016 | Sobe et al. | |

(Continued)

FOREIGN PATENT DOCUMENTS

| | | | | |
|---|---|---|---|---|
| CN | 111223971 A | * | 6/2020 | H10H 20/812 |

OTHER PUBLICATIONS

A Method Of Reducing LED Epitaxial Growth Method Of Quantum Well Dislocation Density, 2020.*

(Continued)

*Primary Examiner* — Nilufa Rahim

(74) *Attorney, Agent, or Firm* — LaBatt, LLC

(57) ABSTRACT

A solution for fabricating a semiconductor structure and the corresponding semiconductor structure are provided. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer.

18 Claims, 7 Drawing Sheets

10A

| | |
|---|---|
| Tensile Layer | 20C |
| Compressive Layer | 18C |
| Tensile Layer | 20B |
| Compressive Layer | 18B |
| Tensile Layer | 20A |
| Compressive Layer | 18A |
| Buffer Layer | 14 |
| Substrate | 12 |

16A

(56)        References Cited

U.S. PATENT DOCUMENTS

| 2017/0098731 | A1  | 4/2017  | Shatalov et al. | |
| 2017/0154986 | A1  | 6/2017  | Su et al. | |
| 2017/0170283 | A1* | 6/2017  | Laboutin | H01L 21/0257 |
| 2019/0019917 | A1  | 1/2019  | Jain et al. | |
| 2022/0131033 | A1* | 4/2022  | Koller | H10H 20/815 |
| 2022/0140087 | A1* | 5/2022  | Fareed | H01L 21/0254 |
|  |  |  |  | 257/190 |
| 2022/0352455 | A1* | 11/2022 | Moe | H10N 30/076 |
| 2022/0376057 | A1* | 11/2022 | Wu | H01L 21/0254 |

OTHER PUBLICATIONS

European Search Report for EP23161962, mailed Jun. 19, 2023, 5 pages.

* cited by examiner

- 2A
- 2B
- 2C
- 2D

TMAl

NH₃

| 5s |3s|5s |3s| 5s |

Multilayer (ML)-AlN Buffer

| Continuous flow AlN (1.3 μm) |
| NH₃ pulse flow AlN (0.3 μm) |
| Continuous flow AlN (1.3 μm) |
| NH₃ pulse flow AlN (0.3 μm) |

Nucleation AlN layer

Sapphire (0001) Substrate

| | |
|---|---|
| Tensile Layer | 20C |
| Compressive Layer | 18C |
| Tensile Layer | 20B |
| Compressive Layer | 18B |
| Tensile Layer | 20A |
| Compressive Layer | 18A |
| Buffer Layer | 14 |
| Substrate | 12 |

| | |
|---|---|
| Compressive Layer | 18C |
| Tensile Layer | 20C |
| Compressive Layer | 18B |
| Tensile Layer | 20B |
| Compressive Layer | 18A |
| Tensile Layer | 20A |
| Buffer Layer | 14 |
| Substrate | 12 |

Figures 3A, 3B, 3C:
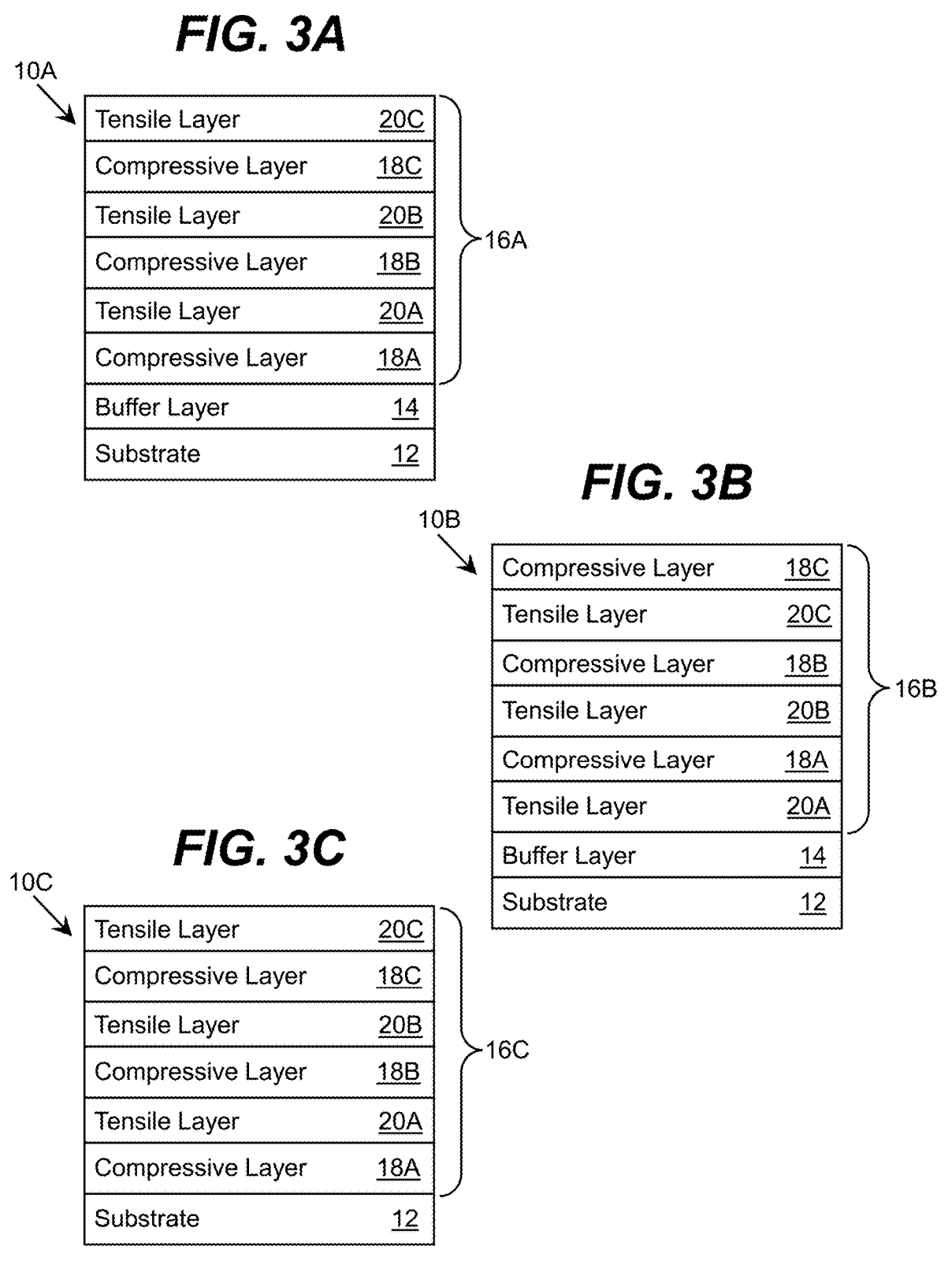

| | |
|---|---|
| Tensile Layer | 20C |
| Compressive Layer | 18C |
| Tensile Layer | 20B |
| Compressive Layer | 18B |
| Tensile Layer | 20A |
| Compressive Layer | 18A |
| Substrate | 12 |

16C

DISLOCATION REDUCTION IN SEMICONDUCTOR COMPOUNDS

REFERENCE TO RELATED APPLICATIONS

The current application claims the benefit of U.S. Provisional Application No. 63/321,539, filed on 18 Mar. 2022, which is hereby incorporated by reference. The current application also is related to U.S. Pat. No. 10,490,697, issued on 26 Nov. 2019, which claims the benefit of U.S. Provisional Application No. 62/527,990, filed on 30 Jun. 2017, and is a continuation-in-part of U.S. Pat. No. 10,158, 044, issued on 18 Dec. 2018, which is a continuation-in-part of U.S. Pat. No. 9,831,382, issued on 28 Nov. 2017, which claims the benefit of U.S. Provisional Application No. 61/566,606, filed on 3 Dec. 2011, all of which are hereby incorporated by reference. The current application is also related to U.S. Pat. No. 10,211,048, issued on 29 Feb. 2019, which claims the benefit of U.S. Provisional Application No. 61/593,426, filed on 1 Feb. 2012, both of which are hereby incorporated by reference.

TECHNICAL FIELD

The disclosure relates generally to growing semiconductor compounds, and more particularly, to an in-situ method of dislocation reduction in growing semiconductor compounds, which can result in a low stress compound.

BACKGROUND ART

Heteroepitaxy of group III-nitride semiconductor films over foreign substrates, such as sapphire, silicon, and silicon carbide, result in a very high density of extended defects, such as threading dislocations. For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers using additional processing steps, such as patterning, sputtering, annealing, and/or require extreme epitaxy conditions, such as high temperatures, extreme low or high V/III molar ratios, etc.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-μm-thick $Al_{0.2}Ga_{0.8}N$ was grown on sapphire without any cracks. Similarly, a superlattice structure shown in FIG. 1A can comprise a periodic structure with each element 2A-2D composed of alternating sublayers of semiconductor materials with different polarizations and different accumulated stresses in the sublayers. Such a superlattice can be used to minimize the dislocation density due to varying stresses in the sublayers of the superlattice elements 2A-2D.

While the superlattice approaches allow some control of tensile and compressive stresses in epitaxially grown nitride semiconductor layers, the approaches do not enable epitaxial growth of nitride based semiconductor layers with uniform composition. To grow such layers, variation of nitrogen and aluminum vacancies has been explored. For example, FIGS. 1B and 1C illustrate one approach for fabricating AlN multilayer buffers according to the prior art. In particular, FIG. 1B shows the gas flow sequence used for $NH_3$ pulse-flow growth, while FIG. 1C shows a schematic structure of the AlN buffer. In a first step, an AlN nucleation layer and an initial AlN layer are deposited using $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ cm$^{-2}$, respectively.

SUMMARY OF THE INVENTION

Aspects of the invention provide a solution for fabricating a semiconductor structure and the corresponding semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown, followed by the growth of a second semiconductor layer having the other of: the tensile stress or the compressive stress directly on the first semiconductor layer. The first and second semiconductor layers include a first dopant and a second dopant, respectively, in order to change the stress in the layer. In this manner, the overall residual stress for the plurality of semiconductor layers can be approximately zero, which can result in the semiconductor structure having a reduced number of cracks and/or threading dislocations than prior art approaches.

A first aspect of the invention provides a method of fabricating a semiconductor structure, comprising: growing a plurality of semiconductor layers over a substrate using a set of epitaxial growth periods, wherein each epitaxial growth period includes: epitaxially growing a first semiconductor layer having one of: a tensile stress or a compressive stress, the first semiconductor layer including a first dopant; and epitaxially growing a second semiconductor layer directly on the first semiconductor layer, wherein the second semiconductor layer has the other of: the tensile stress or the compressive stress, the second semiconductor layer including a second dopant, wherein at least ten percent of an area of an interface between the first and the second semiconductor layers has a shear stress that is greater than a shear stress between two group III nitride semiconductor layers with a lattice mismatch of at least 0.01%.

A second aspect of the invention provides a method of fabricating a semiconductor structure, comprising: growing a plurality of semiconductor layers over a substrate using a set of epitaxial growth periods, wherein each epitaxial growth period includes: epitaxially growing a first semiconductor layer having one of: a tensile stress or a compressive stress, the first semiconductor layer including a first dopant; and epitaxially growing a second group III nitride semiconductor layer directly on the first group III nitride semiconductor layer, wherein the second group III nitride semiconductor layer has the other of: the tensile stress or the compressive stress, the second group III nitride semiconductor layer including a second dopant, wherein at least ten percent of an area of an interface between the first and the second group III nitride semiconductor layers has a shear stress that is greater than 0.02%.

A third aspect of the invention provides a semiconductor structure, comprising: a substrate; and a plurality of semiconductor layers on the substrate, the plurality of semiconductors including a set of epitaxial growth periods, each period including: a first group III nitride semiconductor layer having one of: a tensile stress or a compressive stress, the first group III nitride semiconductor layer including a first dopant; and a second group III nitride semiconductor layer directly on the first group III nitride semiconductor layer, wherein the second group III nitride semiconductor layer has the other of: the tensile stress or the compressive stress, the second group III nitride semiconductor layer including a second dopant, wherein at least ten percent of an area of an interface between the first and the second group III nitride semiconductor layers has a shear stress that is greater than a shear stress between two group III nitride semiconductor layers with a lattice mismatch of at least 0.01%.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 3A-3C show illustrative structures according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
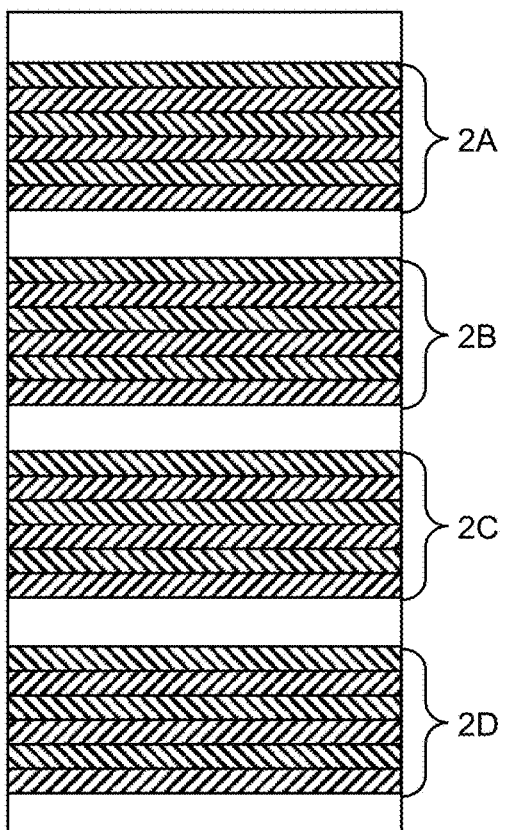
FIGS. 1A-1C show approaches for reducing dislocation density according to the prior art.
Figure 1B:
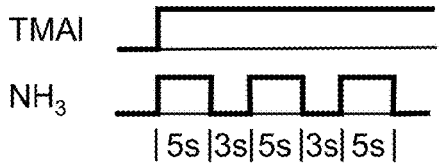
Figure 1C:
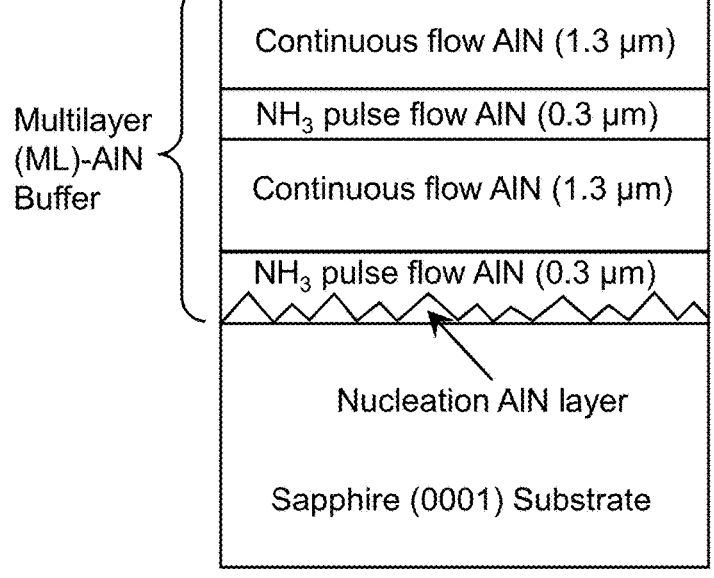

As indicated above, aspects of the invention provide a solution for fabricating a semiconductor structure and the corresponding semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. In this manner, the overall residual stress for the plurality of semiconductor layers can be approximately zero, which can result in the semiconductor structure having a reduced number of cracks and/or threading dislocations than prior art approaches. As used herein, unless otherwise noted, the term "set" means one or more (i.e., at least one) and the phrase "any solution" means any now known or later developed solution.

Aspects of the invention are directed to the growth of semiconductor layers on a substrate. In an embodiment, the semiconductor layers are formed of elements selected from the group III-V materials system. In a more particular embodiment, the semiconductor layers are formed of group III nitride materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

The substrate can comprise any type of substrate exhibiting a lattice mismatch and/or a thermal expansion coefficient mismatch with the semiconductor layer grown thereon. To this extent, the substrate can have a lattice constant and/or a thermal expansion coefficient that is different from a lattice constant and/or a thermal expansion coefficient corresponding to one of the semiconductor layers epitaxially grown thereon. As used herein, a substrate is lattice mismatched with a semiconductor layer when the lattice constants differ by more than one percent (e.g., as calculated by the lattice constant of the semiconductor layer minus the lattice constant of the substrate divided by the lattice constant of the semiconductor layer). As used herein, a substrate has a thermal expansion coefficient mismatch with a semiconductor layer when the thermal expansion coefficients differ by more than one percent. In an embodiment, the substrate is an insulating material, such as sapphire or silicon carbide (SiC). However, the substrate can comprise any suitable material, such as silicon (Si), a nitride substrate (e.g., AlN, GaN, BN, AlGaN, and/or the like), an oxide substrate (e.g., aluminum oxynitride, zinc oxide (ZnO), lithium gallate (LiGaO₂), lithium aluminate (LiAlO₂), magnesium aluminate (MgAl₂O₄), scandium magnesium aluminum oxide (ScMgAlO₄), and/or the like), and/or other related materials.

The layer(s) grown as described herein can be implemented as part of any type of semiconductor device. In an embodiment, the semiconductor device is an emitting device. In a more particular embodiment, the emitting device is configured to operate as a light emitting diode (LED), such as a conventional or super luminescent LED. Similarly, the emitting device can be configured to operate as a laser, such as a laser diode (LD). In another embodiment, the semiconductor device is configured to operate as a photodetector, photomultiplier, and/or the like. Regardless, electromagnetic radiation emitted or detected by the device can comprise a peak wavelength within any range of wavelengths, including visible light, ultraviolet radiation, deep ultraviolet radiation, infrared light, and/or the like.

Aspects of the invention utilize an ability to selectively grow a layer exhibiting either tensile or compressive residual stress depending on the doping conditions. For example, a set of doping conditions for growing an aluminum nitride (AlN) epitaxial layer on a foreign substrate can result in the layer exhibiting either tensile or compressive residual stress. The incorporation of impurities (i.e., doping) in semiconductors has two distinct effects on the lattice parameters. A first effect is a size effect, relating to the difference in the atomic radius between the impurity and the host atom which it replaces. A second effect is an electronic effect, relating to deformation potentials. The change in lattice parameters can cause the epitaxial semiconductor layers to either contract or expand, and thereby change the strain state in the layer. Any of various dopants can be utilized. Illustrative dopants include Arsenic (As), Beryllium (Be), Carbon (C), Calcium (Ca), Cadmium (Cd), Cerium (Ce), Chromium (Cr), Copper (Cu), Dysprosium (Dy), Iron (Fe), Germanium (Ge), Mercury (Hg), Magnesium (Mg), Lithium (Li), Manganese (Mn), Sodium (Na), Oxygen (O), Phosphorous (P), Sulfur (S), Antimony (Sb), Selenium (Se), Silicon (Si), Tin (Sn), Tellurium (Te), Vanadium (V), Zinc (Zn), and/or the like.

The incorporation of impurities by doping can also change the thermal expansion properties of semiconductors. The thermal expansion coefficient (TEC) can increase or decrease based on the dopant type and the absolute change can be controlled by adjusting dopant concentrations. TEC manipulation can help to influence wafer bow, cracks and/or morphology of semiconductor layers, as well as stress-induced optical and electronic properties of semiconductor materials.

Some impurities tend to act as a surfactant and enhance the surface diffusion of atoms on growth surfaces, while other impurities tend to act as an anti-surfactant and limit the surface diffusion of atoms on growth surfaces. A surfactant can increase the grain size in the semiconductor layers, while an anti-surfactant can decrease the grain size in the semiconductor layers. In an embodiment, the smoothness and/or roughness of a semiconductor layer can be controlled using surfactant and/or anti-surfactant impurities. As such, the doping conditions of a semiconductor layer can be utilized to modify the strain state in the semiconductor layer by changing the size of the grains and/or modifying the surface morphologies. Any of various dopants can be utilized. Illustrative dopants include Aluminum (Al), As, Boron (B), Bismuth (Bi), Gallium (Ga), Ge, Hydrogen (H), Indium (In), Mg, Sb, Si, and/or the like. The dopant(s) can also include Be, C, Ca, Cd, Ce, Cr, Cu, Dy, Fe, Hg, Li, Mn, Na, O, P, S, Se, Sn, Te, V, Zn, and/or the like.

In an embodiment, a type of dopant and a concentration of the dopant can be appropriately selected to change the strain state of a semiconductor layer to compressive or tensile strain. Impurity incorporation also can be altered at certain intervals during the growth of the semiconductor layer to alternate between tensile and compressive strains. Alternating between tensile and compressive strains can cause dislocations to bend and interact with each other.

Dislocation interactions can lead to their annihilations and/or fusion, which reduces an overall density of the dislocations in the layer. In an embodiment, more than one dopant can be utilized and different types of dopants (n-type or p-type), in order to achieve a desired lattice strain in the layer.

In an embodiment, growth of a semiconductor heterostructure (e.g., a layer), such as a group III-V based heterostructure, includes growth of a series of layers (e.g., films) with alternating tensile and compressive stresses. A layer can be selectively configured to have tensile or compressive stress by adding a set of dopants in each layer. For example, the type and concentration of the dopant can be selected to yield a compressive or a tensile semiconductor layer. In an embodiment, the growth condition can affect the doping incorporation. For example, growth temperatures, growth rates, as well as V/III ratio, and/or the like can affect the doping efficiency. In an alternate embodiment, the semiconductor heterostructure can include a series of undoped layers that exhibit the desired lattice strain. Additionally, one or more additional deposition conditions can be changed, such as a composition, growth temperature, a gas flow, and/or the like. Furthermore, one or more attributes of the layers, such as a relative thickness of a layer, a distribution of stress within each layer, and/or the like, can be adjusted during the growth of the layer. The addition of one or more dopants in the semiconductor layers can result in regions of increased compressive stresses and regions of increased tensile stresses. In this manner, the resulting semiconductor structure can be configured to have a target overall residual stress. For example, in an embodiment, the compressive stresses and the tensile stresses are configured to be approximately the same, thereby resulting in a condition of approximately zero (or near zero) overall residual stress.

Figure 2:
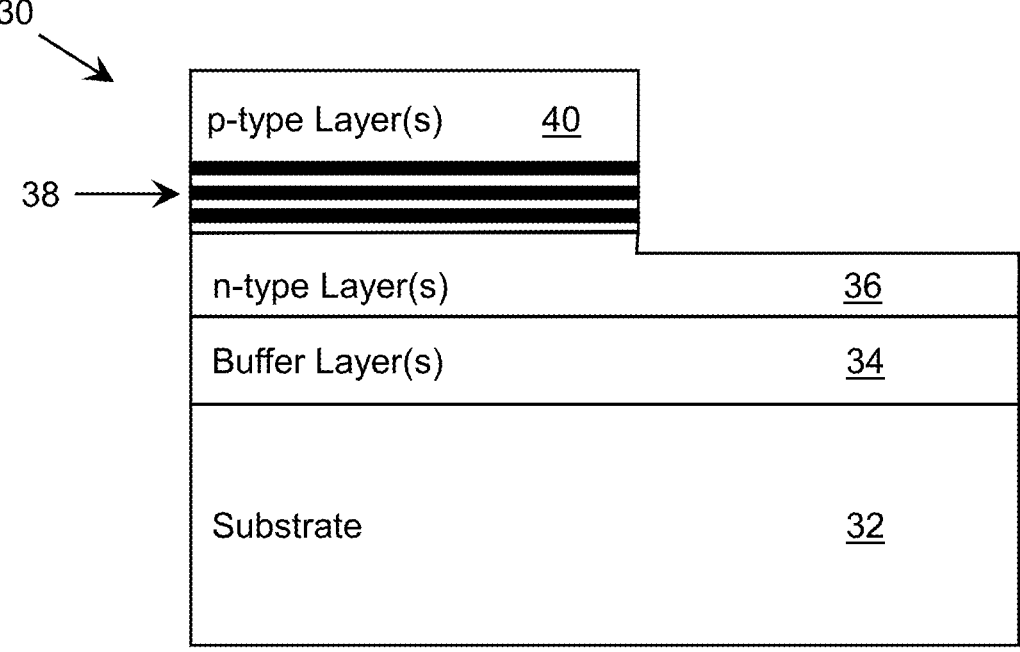
FIG. 2 shows an illustrative structure according to an embodiment.

Turning to FIG. 2, an illustrative device structure 30 is shown according to an embodiment. The structure 30 can include a substrate 32 and one or more buffer layers 34 located thereon. In an embodiment, one or more of the buffer layers 34 are fabricated as described herein. The structure 30 further includes one or more n-type layers 36 located on the buffer layer 34, an active region 38, and one or more p-type layers 40. In an embodiment, one or more of the n-type layers 36 are fabricated as described herein. The structure 30 is shown including a mesa region which includes the p-type layer(s) 40, the active region 38, and a portion of the n-type layer 36. However, it is understood that this structure 30 is only illustrative of various heterostructures that can include one or more layers fabricated as described herein.

As discussed herein, the structure 30 can be used to fabricate any of various types of semiconductor devices. In an embodiment, the semiconductor device comprises an optoelectronic device. In this case, the structure 30 can be configured to emit or sense electromagnetic radiation. In a more particular embodiment, the semiconductor device comprises an emitting device, which emits electromagnetic radiation in any spectrum thereof. In this case, the active region 38 can include one or more quantum wells, each of which emits radiation during operation of the device. In a still more particular embodiment, the emitting device is configured to emit deep ultraviolet electromagnetic radiation.

FIGS. 3A-3C show illustrative structures 10A-10C according to embodiments. Each structure 10A-10C includes a substrate 12, which can be a foreign substrate, such as sapphire, SiC, or the like. Furthermore, the structures 10A, 10B include a buffer layer 14 (e.g., a nucleation layer) grown directly on the substrate 12. The buffer layer 14 can provide a transition to accommodate a large lattice mismatch between the substrate 12 and the subsequent semiconductor heterostructure 16A-16C.

As described herein, in embodiments, the heterostructure 16A-16C can comprise a buffer layer 34 (FIG. 2) or an n-type layer 36 (FIG. 2) in a device heterostructure. When the heterostructure 16A-16C corresponds to the buffer layer 34, the buffer layer 14, if included, can correspond to a nucleation layer, an initial AlN layer deposited using $NH_3$ pulse-flow growth, and/or the like. While not shown for clarity, it is understood that an embodiment of a structure described herein can include both a buffer layer 34 and an n-type layer 36 fabricated using a semiconductor heterostructure 16A-16C described herein.

Regardless, in an embodiment, the buffer layer 14 can comprise an $Al_xGa_{1-x}N/Al_yGa_{1-y}N$ superlattice, where $0 \le x$, $y \le 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from approximately 0.01 micrometers to approximately 10 micrometers. In an embodiment, the buffer layer 14 can be deposited ex-situ using metal organic chemical vapor deposition method, a sputtering technique, or a physical vapor deposition method. In an embodiment, the ex-situ deposited buffer layer 14 can be treated ex-situ or in-situ at a temperature between approximately 1000 degrees Celsius and approximately 2000 degrees Celsius. However, as illustrated by the structure 10C, embodiments of the structure can be formed without the buffer layer 14, e.g., based on the material of the substrate 12 and/or the corresponding lattice mismatch.

Regardless, each of the structures 10A-10C includes a semiconductor heterostructure 16A-16C grown on the substrate 12. Each semiconductor heterostructure 16A-16C is formed of a plurality of compressive layers 18A-18C alternating with a plurality of tensile layers 20A-20C. In the structures 10A, 10C, a compressive layer 18A is first grown, while in the structure 10B, a tensile layer 20A is first grown. While not shown, it is understood that an embodiment of a semiconductor heterostructure described herein can include a compressive layer first grown directly on a substrate 12.

While each semiconductor heterostructure 16A-16C is shown including three periods of epitaxial growth (e.g., each period including a compressive and a tensile layer), it is understood that a semiconductor heterostructure can include any number of periods. In an embodiment, the stress changes abruptly between a compressive layer and the adjacent tensile layer. Alternatively, the stress can gradually change between adjacent layers (e.g., by growing layers having a graded tensile or compressive stress by grading the dopant concentrations or grading the growth conditions, such as temperature, growth rates, and/or V/III ratio). Furthermore, the tensile and compressive stress can be substantially constant between periods of the semiconductor heterostructure 16A-16C or can gradually change from period to period.

The growth of a semiconductor heterostructure 16A-16C, and the growth of the corresponding layers 18A-18C, 20A-20C forming the semiconductor heterostructure 16A-16C, can include one or more types of dopants with a corresponding dopant concentration. For example, the layers 18A-18C, 20A-20C can include a set of dopants including Arsenic (As), Beryllium (Be), Carbon (C), Calcium (Ca), Cadmium (Cd), Cerium (Ce), Chromium (Cr), Copper (Cu), Dysprosium (Dy), Iron (Fe), Germanium (Ge), Mercury (Hg), Magnesium (Mg), Lithium (Li), Manganese (Mn), Sodium (Na), Oxygen (O), Phosphorous (P), Sulfur (S), Antimony (Sb), Selenium (Se), Silicon (Si), Tin (Sn), Tellurium (Te), Vanadium (V), Zinc (Zn), and/or the like. Furthermore, a layer 18A-18C, 20A-20C can be grown to a thickness that is greater than a critical thickness to avoid pseudomorphic growth. In an embodiment, each layer 18A-18C, 20A-20C has a thickness between approximately 10 nanometers and 10 micrometers.

As described herein, during the growth of a semiconductor heterostructure 16A-16C, dopants (i.e., impurities) can be added to the layers 18A-18C, 20A-20C to cause the resulting layer 18A-18C, 20A-20C to exhibit either tensile or compressive residual stress. For example, the layers 18A-18C, 20A-20C can include any one or more of the dopants listed above. In an embodiment, each layer 18A-18C, 20A-20C can include one or more dopants with a dopant concentration of each dopant ranging from $1 \times 10^{15}$ $cm^{-3}$ to $1 \times 10^{21}$ $cm^{-3}$. The dopant(s) in the first layer (e.g., layers 18A-18C) can be different from the dopant(s) in the second layer (e.g., layers 20A-20C). A dopant can increase or decrease a semiconductor's lattice parameter based on its relative size. A dopant which increases the lattice size would generally produce compressive strain, whereas a dopant which reduces the lattice size would generally produce tensile strain. Strain generally increases with an increase in dopant concentrations. In an embodiment, at least ten percent of an area at an interface between a compressive layer 18A-18C and a tensile layer 20A-20C can have a shear stress that is greater than a shear stress between two group III nitride semiconductor layers having a lattice mismatch of at least 0.01%. In a further embodiment, a compressive layer 18A-18C and a tensile layer 20A-20C have a lattice mismatch of at least 0.02%.

As used herein, two materials can have comparable compositions when the molar fractions of the corresponding materials differ by at most ten percent (five percent in a more specific embodiment). For example, consider two group III nitride materials, $Al_xIn_yB_zGa_{1-x-y-z}N$ and $Al_{x'}In_{y'}B_{z'}Ga_{1-x'-y'-z'}N$. The two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). Unless otherwise specified, two layers have similar thicknesses when the respective thicknesses are within one nanometer (inclusive) of each other. Similarly, two layers have different thicknesses when the thicknesses differ by more than one nanometer. It is understood that two numbers are on the same order as one another when a ratio of the higher number to the lower number is less than ten.

Compositions of two semiconductor layers also can be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3 kT. A composition of a first semiconductor layer is considered larger than a composition of a second semiconductor layer when the band gap of the first semiconductor layer is larger than the band gap of the second semiconductor layer by more than the thermal energy unit, kT. A composition of a first semiconductor layer is considered substantially larger than a composition of a second semiconductor layer when the band gap of the first semiconductor layer is larger than the band gap of the second semiconductor layer by more than three times the thermal energy unit, 3 kT. Unless otherwise specified, the thermal energy unit is approximated as 0.026 eV.

In an embodiment, each epitaxial growth period (a compressive layer 18A-18C and a tensile layer 20A-20C) can be thermally treated ex-situ or in-situ at a temperature between approximately 1000 degrees Celsius and approximately 2000 degrees Celsius prior to growing another epitaxial growth period. This thermal treatment can generate additional point defects in the layers which interact with dislocations to reduce their density.

In an embodiment, surface roughness (or smoothness) of semiconductor layers 18A-18C, 20A-20C can be controlled using surfactant and anti-surfactant dopants (impurities). Surfactant impurities enhance diffusion of atoms on growth surfaces to increase the grain size in the semiconductor layers 18A-18C, 20A-20C, while anti-surfactant impurities limit diffusion of atoms on growth surfaces to decrease the grain size in the semiconductor layers 18A-18C, 20A-20C. Surfactant impurities generally make the layers flatter/smoother, whereas anti-surfactant impurities make them rougher. Surfactant impurities can help increase the mobility of adatoms on the growth surfaces and anti-surfactant dopants work in the opposite manner. Grain size of the films increases or reduces based on the impurity type, which in turn also affects the strain state of the film. Dislocations bend at the interface of the layers with different strain states. Surfactant and anti-surfactant dopants include Al, As, B, Bi, Ga, Ge, H, In, Mg, Mn, Sb, Si, and/or the like.

Figure 4:
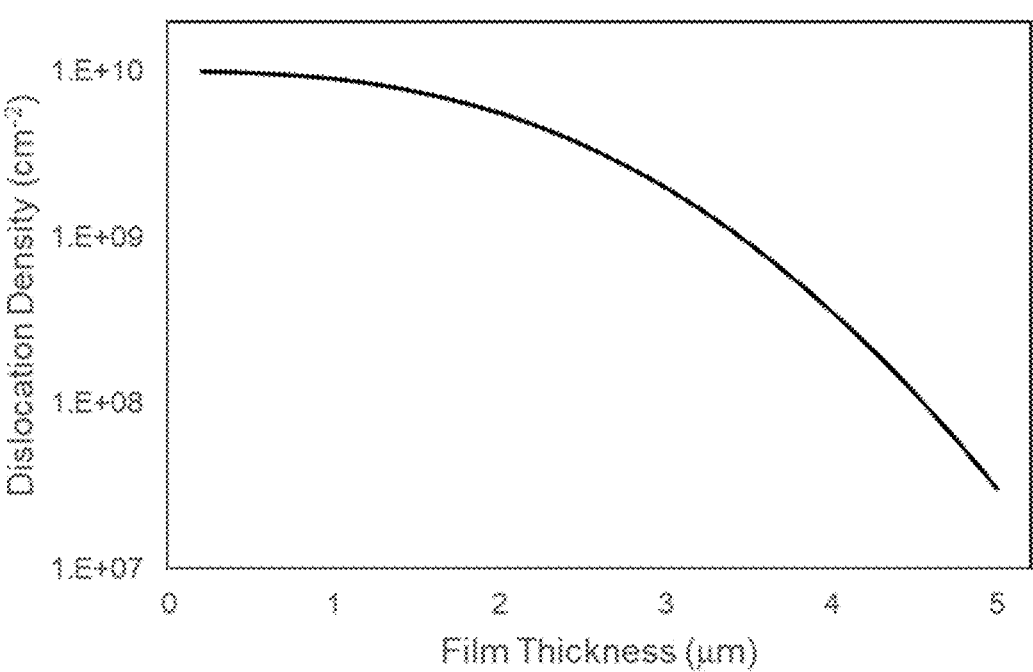
FIG. 4 shows an illustrative plot of dislocation density as a function of layer thickness according to an embodiment.

In an embodiment, the dislocation density within a semiconductor layer can be related to a thickness of the semiconductor layer. To this extent, FIG. 4 shows an illustrative plot of dislocation density as a function of layer thickness according to an embodiment. Dislocation interactions are proportional to their density. Dislocation reduction is highest within first 1 micron of the film thickness.

Figure 5:
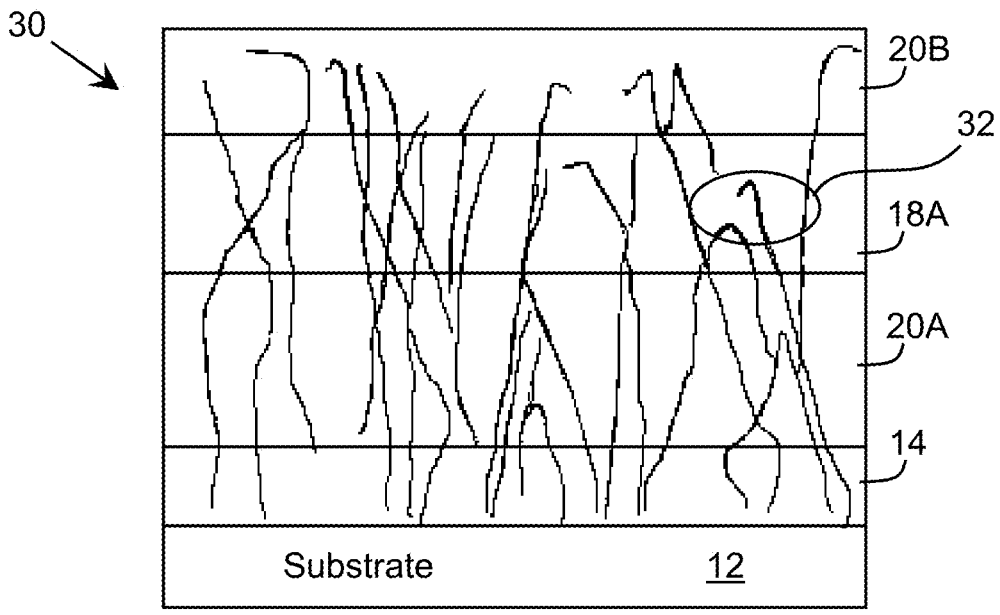
FIG. 5 shows a possible mechanism for the reduction of dislocation density provided by a growth procedure described herein.

FIG. 5 shows a possible mechanism for the reduction of dislocation density provided by a growth procedure described herein. As illustrated, the structure 30 includes a substrate 12, a buffer layer 14, a layer 20A having a tensile stress, a layer 18A having a compressive stress, and a layer 20B having a tensile stress. A series of dislocations can propagate from the substrate 12 into the upper layers. However, as the dislocations propagate, some or all of the dislocations will tend to bend, such as shown in the region 32, due to the tensile and compressive stresses. As a result, a number of threading dislocations present in the upper regions of the structure 30, e.g., in layer 20B, can be significantly reduced from the number propagating from substrate 12.

In an embodiment, a surface of one or more layers can be patterned, which can be configured to provide an additional relaxation mechanism for reducing cracks and/or threading dislocations in a structure. For example, a surface of the substrate 12 (FIGS. 2A-2C) and/or the buffer layer 14 (FIGS. 2A-2C) can be patterned, e.g., using etching, masking, a combination of etching and masking, and/or the like. A layer, such as the buffer layer 14 and/or any layer located above the buffer layer, can be grown in multiple steps, one or more of which can include patterning. Such patterning can be achieved by etching and/or masking the layer, masking and subsequent overgrowth, by producing voids during overgrowth process, and/or the like. Regardless, the patterning can be configured to reduce an overall stress accumulated in the corresponding layer structure.

It is understood that a device or a heterostructure used in forming a device including a structure described herein can be fabricated using any solution. For example, a device/heterostructure can be manufactured by obtaining (e.g., forming, preparing, acquiring, and/or the like) a substrate 12, forming (e.g., growing) a buffer layer 14 thereon, and growing a semiconductor heterostructure 16 as described herein. Furthermore, the fabrication can include patterning a surface of the substrate 12, the buffer layer 14, and/or a semiconductor layer as described herein, the deposition and removal of a temporary layer, such as mask layer, the formation of one or more additional layers not shown, and/or the like. Additionally, one or more metal layers, contacts, and/or the like can be formed using any solution. The heterostructure/device also can be attached to a submount via contact pads using any solution.

The patterning of a layer can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, the locations of the masked and/or opening portions for a repetition can be vertically offset from the locations of the adjacent repetition.

Figure 6:
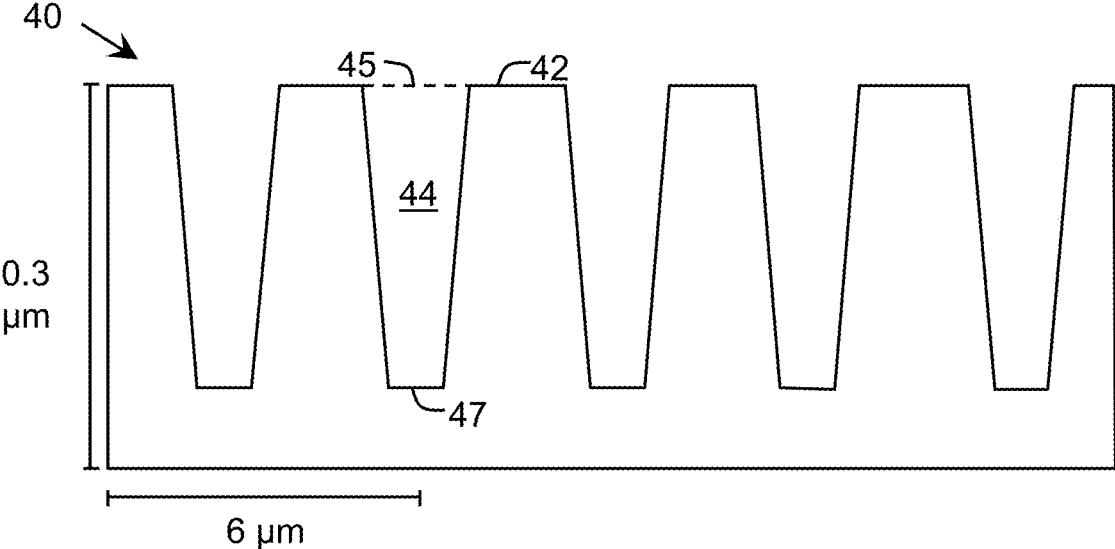
FIGS. 6 and 7 show a side view and a top view of an illustrative patterned surface according to an embodiment.
Figure 7:
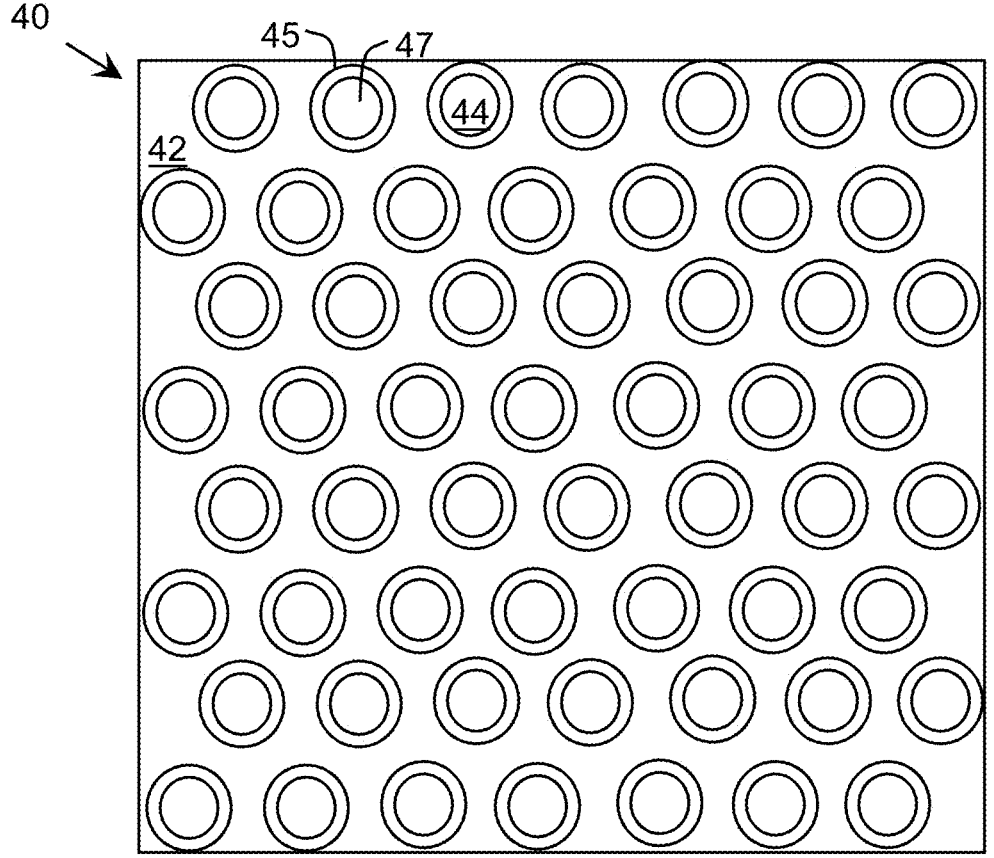

FIGS. 6 and 7 show a side view and a two dimensional top view, respectively, of an illustrative patterned surface 40 according to an embodiment. In this case, the patterned surface 40 includes a top surface 42 into which a plurality of openings 44 are formed. The openings 44 can be spaced from one another by a distance less than approximately twice a diameter of a top opening 45. In an embodiment, the spacing between the openings 44 can be between approximately 200 nm to approximately 3.5 μm. In an embodiment, each opening 44 can have a top opening 45 and a bottom surface 47. In an embodiment, the top opening 45 has a diameter that is between approximately 100 nm and approximately 2.0 μm, and the bottom surface 47 has a diameter that is between approximately 100 nm and approximately 1.5 μm.

Furthermore, the openings 44 can be spaced from one another by approximately 3.5 μm center to center. As illustrated in FIG. 7, the openings can have substantially circular cross sections and be formed in a hexagonal pattern. However, it is understood that the openings 44 can comprise any combination of one or more of various types/shapes of cross-sectional patterns and form any type of pattern.

Figure 8:
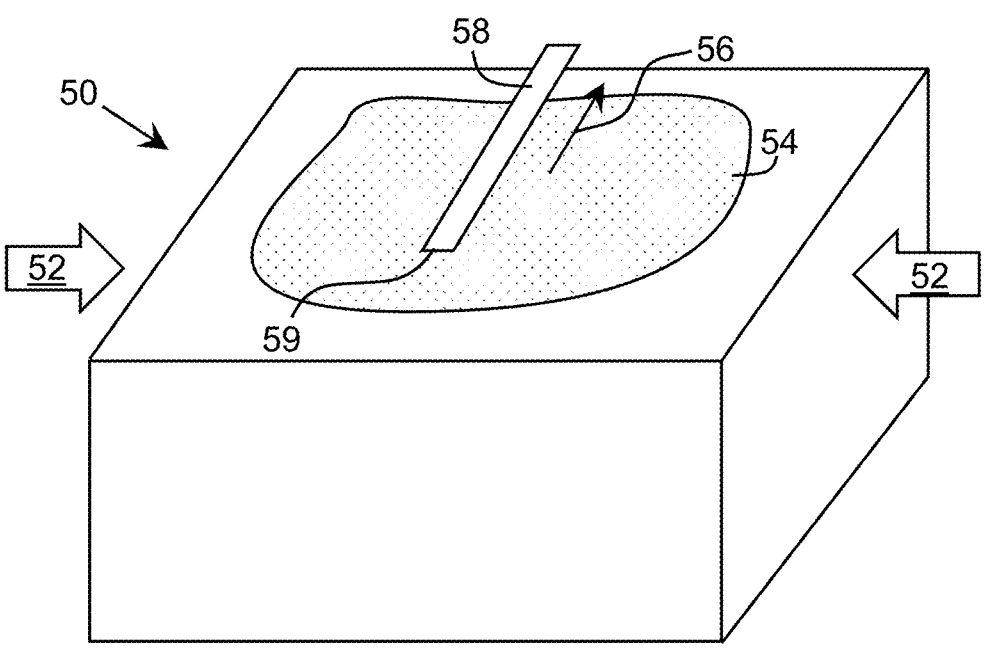
FIG. 8 shows a schematic of an illustrative mechanism for pushing out dislocations from a crystal using misfit stress according to an embodiment.

FIG. 8 shows a schematic of an illustrative mechanism for pushing out dislocations from a crystal 50 using misfit stress 52 according to an embodiment. In an embodiment, the crystal 50 comprises a set of self-assembly strain-modulated (SASM) group III-nitride semiconductor layers, which are periodically grown on a foreign (e.g., lattice mismatched) substrate using a growth process described herein. Such a growth process can include modulating the internal strain in the epilayers. In particular, the addition of impurities/dopants and/or modulation of a set of deposition conditions, such as temperature, V/III ratio, and/or the like, can produce layers of varying internal strain. The addition of dopants and/or the modulation can be configured to generate sufficient shear stress to yield a substantially crack-free group III nitride semiconductor layer with low edge- and screw-dislocation densities. In an embodiment, the growth process includes growing a layer to a thickness sufficient to create a shear stress sufficient to turn a set of threading dislocations in the semiconductor structure from a direction primarily in a direction of the c-axis to a direction primarily in a c-plane of the semiconductor structure. For example, a layer thickness buildup of up to five micrometers resulted in an edge dislocation density rapidly decreasing from $10^{10}/\text{cm}^2$ in the proximity of where the group III-nitride layer contacts the substrate to lower than $10^8/\text{cm}^2$ at an opposing side of the layer.

Growth of illustrative group III nitride semiconductor layers (e.g., AlN and AlGaN) using a growth procedure described herein were analyzed at various thicknesses using high resolution XRD (HRXRD). The analysis indicated that the compressive stress 52 present in the layer varies with the thickness of the layer. To relieve this stress 52, an edge dislocation can be dissociated into leading and trailing dislocations in the basal plane (e.g., (0001) lattice plane). A buildup in compressive (or tensile) stress 52 results in elevated values of elastic energy 54 in the layers of the crystal 50 and can cause a shear stress 56 in the (0001) lattice plane. The shear stress 56 can push an edge dislocation formed by an extra plane of atoms 58 and having a dislocation core 59 from the prism plane (e.g., (1100) lattice plane) into the (0001) lattice plane during growth.

In an embodiment, a thickness of the one or more of two adjacent layers in the crystal 50 and/or a lattice mismatch between the two layers can be selected based on a target shear stress 56 and/or a target compressive stress 52 within the adjacent layers and/or an interface of the adjacent layers. The thickness(es) and/or lattice mismatches can be selected to cause a desired amount/percentage of edge dislocations to dissociate into leading and trailing dislocations in the basal plane between the bottom of the layers to the top of the layers (e.g., at least an order of magnitude reduction in edge dislocations). In a more particular embodiment, the thickness(es) and/or lattice mismatch creates a target level of compressive stress 52 in a minimum percentage of the layers. In a still more particular embodiment, the minimum percentage of the layers is approximately ten percent and the target level of compressive stress 52 is approximately ten MegaPascal (MPa). In another embodiment, the compressive stress 52 at the interface of two layers is greater than a compressive stress 52 present between two group III nitride semiconductor layers having a lattice mismatch of at least 0.01%. In a more particular embodiment the compressive stress 52 is greater than a compressive stress 52 present between two group III nitride semiconductor layers having a lattice mismatch of at least 0.05%.

A change in the set of growth conditions also can be based on one or more attributes of the materials, such as the elasticity of the materials. For example, the lattice mismatches described herein can generate a target amount of compressive stress 52 between two layers of material having an elasticity corresponding to an elasticity of a group III nitride material with an aluminum molar fraction of at least eighty percent. However, it is understood that the values described herein are only illustrative. To this extent, a minimum percentage and/or target level of compressive stress 52 can vary based on the materials of the layers, a target amount/percentage of edge dislocations dissociating into leading and trailing dislocations in the basal plane, one or more device performance factors for the layers, and/or the like.

Figure 9:
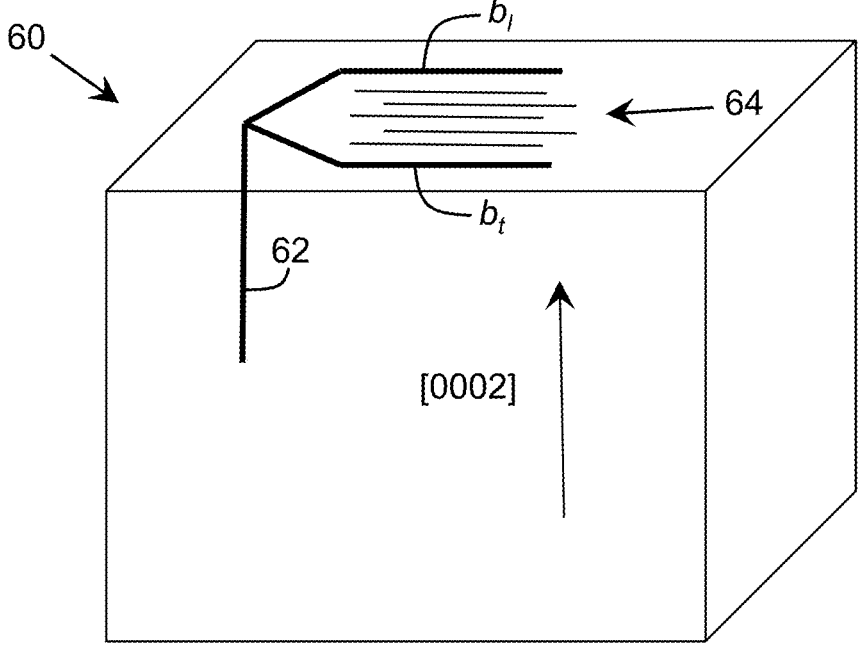
FIG. 9 shows an illustrative schematic of dislocation conversion in a crystal according to an embodiment.

As discussed herein, when an edge dislocation lays in the (0001) lattice plane, it dissociates into partial dislocations in the basal plane. FIG. 9 shows an illustrative schematic of dislocation conversion in a crystal 60 according to an embodiment. As illustrated, an edge dislocation 62 is pushed from the prism plane to the lattice plane, and dissociates into a leading partial dislocation, $b_l$, and a trailing partial dislocation, $b_t$. A set of basal stacking faults (BSFs) 64 are shown located in a region between the partial dislocations $b_l$, $b_t$. The BSFs 64 can be caused by the energy principle: $E_b \leq E_l + E_t + \Sigma_{sf}$, where $E_b$ is the energy of an edge dislocation 52; $E_t$ is the energy of the leading partial dislocation; $E_t$ is the energy of the trailing partial dislocation; and $\Sigma_{sf}$ is the energy of the stacking faults 64.

The energy associated with the threading edge dislocation $E_b$ is directly proportional to the square of the magnitude of the Burgers vector. For an AlN crystal layer, an edge dislocation 62 in the prism plane is characterized by a Burgers vector b, having an amplitude, |b|, equal to the crystal lattice constant a of AlN, which is approximately a=3.112 angstroms (A). In this case, the energy of the edge dislocation $E_b$ is proportional to $a^2$. Each partial dislocation $b_l$, $b_t$ has an amplitude of $a/\sqrt{3}$ and a corresponding energy $E_l$, $E_t$ proportional to $a^2/3$. As a result, the two partial dislocations $b_l$, $b_t$ have significantly less energy than the edge dislocation 62, e.g., $E_l + E_t = 2a^2/3 < E_b = a^2$. In AlN, the energy of a stacking fault $\Sigma_{sf}$ has been shown to be approximately 80 mJ/m$^2$, while the energy of a single edge dislocation 62 has been shown to be approximately 14 nJ/m. During the layer growth, the smallest incremental dislocation length is the lattice constant c, which for AlN is approximately 4.98 angstroms. Thus, the incremental edge dislocation energy for the distance c is given by $E_b = 70 \cdot 10^{-19}$ J=43 electron volts (eV). As described herein, the combined energies of the partial dislocations is smaller, e.g., per unit length, the combined energies $E_l$, $E_t$ are approximately two thirds of the energy of the edge dislocation 62, or approximately 9 nJ/m.

Since the partial dislocations $b_l$, $b_t$ lay in the basal c-plane, the incremental growth distance of the partial dislocations $b_l$, $b_t$ is the lattice constant a, from which it follows that $E_l + E_t \sim 28$ eV. Consequently, the overall energy savings for one step of growth is approximately 15 eV. A portion of the recovered energy is goes toward the energy of the stacking fault $\Sigma_{sf}$. An energy for the stacking fault, $\Sigma_{sf} = 15$ eV corresponds to a stacking fault area of approximately 1500 A$^2$. As a result, the partial dislocations $b_l$, $b_t$ propagate in the c-plane in close proximity to each other in order to preserve a favorable energy balance. An overall energy also is reduced by partially relieving misfit compressive or tensile stress 52 (FIG. 8) due to the misfit strain. For example, a compressive strain can increase as a function of the thickness of the film. The partial dislocations $b_l$, $b_t$ can play a role of misfit dislocations relieving stress in thick semiconductor layers.

Because of a lower energy, a dissociated edge dislocation in the (0001) plane will not turn back into the prism plane.

Rather, the dislocation will grow out of the crystal 60 from an edge side. Additionally, dislocation regeneration can be further suppressed by grading the layer materials (e.g., AlGaN, superlattice structure, and/or the like). Therefore, using a SASM growth technique described herein, edge and screw dislocations can be dramatically decreased, e.g., by one or more orders of magnitude. Furthermore, for illustrative group III nitride semiconductor layers and multiple quantum well structures grown using a SASM growth technique described herein, a time resolved photoluminescence (TRPL) lifetime improved significantly (50-100 times), e.g., by up to approximately two nanoseconds.

Figure 10:
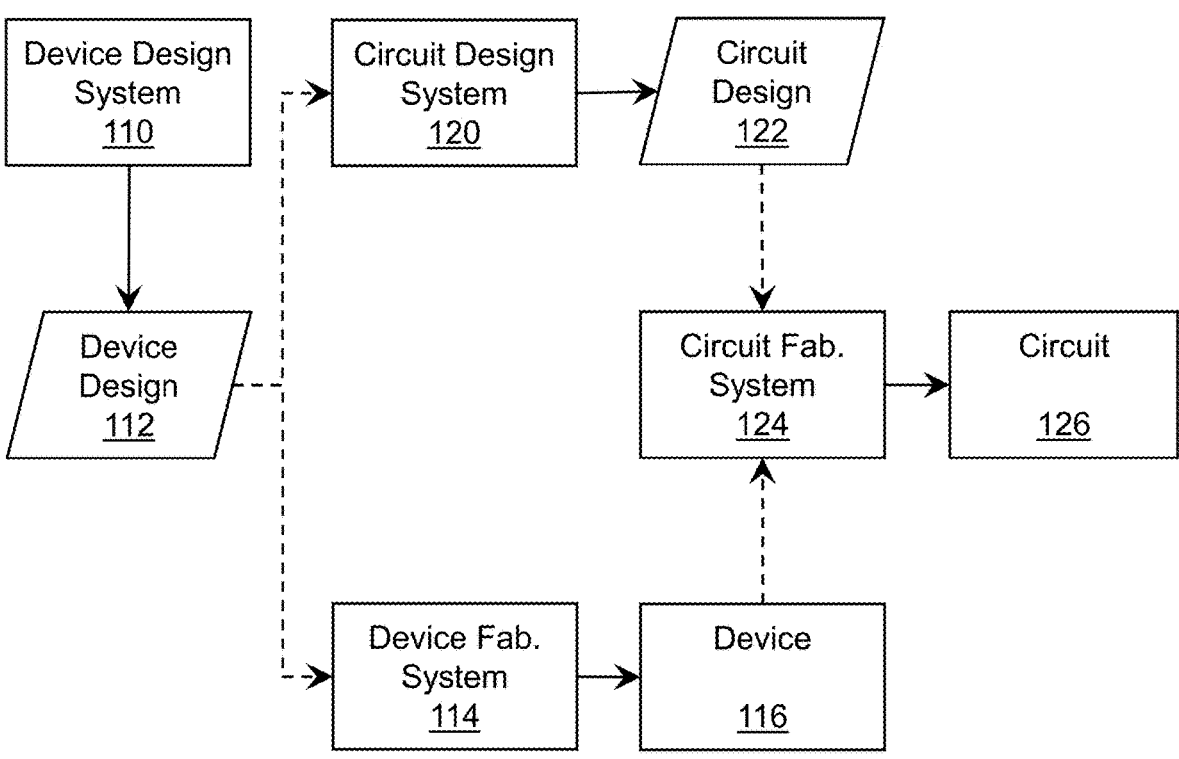
FIG. 10 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor structure, comprising:
a substrate; and
a plurality of semiconductor layers located over the substrate, the plurality of semiconductor layers including a set of epitaxial growth periods, each epitaxial growth period including:
a first semiconductor layer formed of a group III nitride material and having one of: a tensile stress or a compressive stress, wherein the first semiconductor layer includes a first surface roughness; and
a second semiconductor layer directly on the first semiconductor layer and formed of the group III nitride material, wherein the second semiconductor layer has the other of: the tensile stress or the compressive stress, wherein at least ten percent of an area of an interface between the first and the second semiconductor layers has a shear stress that is greater than a shear stress between two group III nitride semiconductor layers with a lattice mismatch of at least 0.01%, wherein the second semiconductor layer includes a second surface roughness, and wherein the first surface roughness and the second surface roughness differ by at least 0.02%.

2. The semiconductor structure of claim 1, wherein at least one of the first semiconductor layer or the second semiconductor layer is doped with a dopant configured to increase the tensile stress or the compressive stress of the group III nitride material.

3. The semiconductor structure of claim 2, wherein a dopant for the at least one of the first semiconductor layer or the second semiconductor layer includes at least one of: Arsenic (As), Beryllium (Be), Carbon (C), Calcium (Ca), Cadmium (Cd), Cerium (Ce), Chromium (Cr), Copper (Cu), Dysprosium (Dy), Iron (Fe), Germanium (Ge), Mercury (Hg), Magnesium (Mg), Lithium (Li), Manganese (Mn), Sodium (Na), Oxygen (O), Phosphorous (P), Sulfur(S), Antimony (Sb), Selenium (Se), Silicon (Si), Tin (Sn), Tellurium (Te), Vanadium (V), and Zinc (Zn).

4. The semiconductor structure of claim 2, wherein a dopant concentration for the dopant is between $1\times10^{15}$ cm$^{-3}$ to $1\times10^{21}$ cm$^{-3}$.

5. The semiconductor structure of claim 1, wherein a thickness of each layer is between approximately 10 nanometers and approximately 10 micrometers.

6. The semiconductor structure of claim 1, further comprising a buffer layer directly on the substrate, wherein the first semiconductor layer is located directly on the buffer layer.

7. The semiconductor structure of claim 1, wherein the first semiconductor layer and the second semiconductor layer have a lattice mismatch of at least 0.02%.

8. The semiconductor structure of claim 1, wherein a composition of the first semiconductor layer and a composition of the second semiconductor layer differ by at most approximately five percent.

9. The semiconductor structure of claim 1, wherein a thickness of each of the semiconductor layers is greater than a critical thickness to avoid pseudomorphic growth.

10. A semiconductor structure, comprising:
a substrate; and
a plurality of semiconductor layers on the substrate, the plurality of semiconductors including a plurality of epitaxial growth periods, each epitaxial growth period including:
a first group III nitride semiconductor layer formed of a group III nitride material and having one of: a tensile stress or a compressive stress, the first group III nitride semiconductor layer including a first dopant configured to increase the one of the tensile stress or the compressive stress of the first group III nitride semiconductor layer; and
a second group III nitride semiconductor layer directly contacting the first group III nitride semiconductor layer and formed of the group III nitride material, wherein the second group III nitride semiconductor layer has the other of: the tensile stress or the compressive stress, wherein the second group III nitride semiconductor layer includes a second dopant configured to increase the other of the tensile stress or the compressive stress of the second group III nitride semiconductor layer, wherein at least ten percent of an area of an interface between the first and the second group III nitride semiconductor layers has a shear stress that is greater than a shear stress between two group III nitride semiconductor layers with a lattice mismatch of at least 0.01%.

11. The semiconductor structure of claim 10, wherein the first dopant causes the first group III nitride semiconductor layer to expand.

12. The semiconductor structure of claim 10, wherein the first dopant causes the first group III nitride semiconductor layer to contract.

13. The semiconductor structure of claim 10, wherein the first dopant acts as a surfactant.

14. The semiconductor structure of claim 10, wherein a dopant concentration for the first dopant is between $1\times10^{15}$ cm$^{-3}$ to $1\times10^{21}$ cm$^{-3}$.

15. A semiconductor device, comprising:
a substrate;
a buffer layer located on the substrate, wherein the buffer layer comprises a semiconductor heterostructure including a plurality of semiconductor layers, the plurality of semiconductor layers including a plurality of epitaxial growth periods, each epitaxial growth period including:
a first semiconductor layer formed of a group III nitride material and having one of: a tensile stress or a compressive stress, the first group III nitride semiconductor layer including a first dopant configured to increase the one of the tensile stress or the compressive stress of the first group III nitride semiconductor layer; and
a second semiconductor layer directly contacting the first semiconductor layer and formed of the group III nitride material, wherein the second semiconductor layer has the other of: the tensile stress or the compressive stress, wherein the second group III nitride semiconductor layer includes a second dopant configured to increase the other of the tensile stress or the compressive stress of the second group III nitride semiconductor layer, wherein at least ten percent of an area of an interface between the first and the second semiconductor layers has a shear stress that is greater than a shear stress between two group III nitride semiconductor layers with a lattice mismatch of at least 0.01%.

16. The device of claim 15, further comprising an n-type semiconductor layer located directly on the buffer layer.

17. The device of claim 15, further comprising an active layer located on the buffer layer.

18. The device of claim 17, wherein the active layer is configured to emit electromagnetic radiation during operation of the device.

* * * * *